United States Patent [19]

Van Rees

[11] Patent Number: 4,632,710
[45] Date of Patent: Dec. 30, 1986

[54] VAPOR PHASE EPITAXIAL GROWTH OF CARBON DOPED LAYERS OF GROUP III-V MATERIALS

[75] Inventor: H. Barteld Van Rees, Newton Upper Falls, Mass.

[73] Assignee: Raytheon Company, Lexington, Mass.

[21] Appl. No.: 493,172

[22] Filed: May 10, 1983

[51] Int. Cl.[4] .................... H01L 21/205; H01L 21/84
[52] U.S. Cl. .................................... 148/175; 29/571; 29/576 E; 148/174; 148/DIG. 23; 148/DIG. 40; 148/DIG. 65; 148/DIG. 88; 156/610; 156/612; 156/613; 156/614; 357/22; 357/61; 357/63; 357/64
[58] Field of Search ............... 148/174, 175, DIG. 23, 148/DIG. 40, DIG. 65, DIG. 88; 29/571, 576 E; 156/610, 612–614; 357/22, 61, 63, 64

[56] References Cited

U.S. PATENT DOCUMENTS

| | | | |
|---|---|---|---|
| 3,635,771 | 1/1972 | Shaw | 148/175 |
| 3,868,281 | 2/1975 | Morgan | 357/17 X |
| 3,881,113 | 4/1975 | Rideout et al. | 357/19 X |
| 4,196,439 | 4/1980 | Niehaus et al. | 357/22 |
| 4,204,893 | 5/1980 | Cox | 148/175 |
| 4,498,093 | 2/1985 | Allyn et al. | 357/22 |

OTHER PUBLICATIONS

Dean et al, "Optical Properties . . . Carbon . . . in Gallium Phosphide", J. Appl. Physics, vol. 39, No. 12, Nov. 1968, pp. 5631–5646.
Sansbury et al., "Conductivity . . . Silicon in . . . Gallium Arsenide", Appl. Physics Letters, vol. 14, No. 10, May 15, 1969, pp. 311–313.
Miller et al., "Effect of Gas-Phase Stoichiometry . . . GaAs", Appl. Physics Letters, vol. 31, No. 8, Oct. 15, 1977, pp. 538–540.
Effer, D., "Epitaxial Growth of . . . GaAs in Open Flow System", J. Electrochem. Soc., vol. 112, No. 10, Oct. 1985, pp. 1020–1025.
Hoyt et al., "Preparation . . . Gallium Arsenide by Iron Doping", J. Electrochem. Soc., vol. 113, No. 3, Mar. 1966, pp. 296–297.
"Compensation Mechanism in Liquid Encapsulated Czochralski GaAs: Importance of Melt Stoichiometry," by D. E. Holmes, R. T. Chen, K. R. Elliott, C. G. Kirkpatrick and P. Won Yu, IEEE Transactions on Microwave Theory and Techniques, vol. MTT-30, No. 7, Jul. 1982.

Primary Examiner—William G. Saba
Attorney, Agent, or Firm—Denis G. Maloney; Richard M. Sharkansky; John T. Meaney

[57] ABSTRACT

An epitaxially grown high resistivity crystalline layer of gallium arsenide is produced in a reactor vessel with a predetermined amount of carbon dioxide introduced during growth of the high resistivity gallium arsenide (GaAs) crystalline layer to provide carbon as a dopant. Thus, a plurality of carbon atoms is provided in the crystal, such carbon atoms having electrons at energy levels between a valance energy band and a conduction energy band of the GaAs crystal. With these energy levels, the carbon atoms are substantially ionized at room temperature by accepting a plurality of electrons from the valance band of the GaAs. The presence of these carbon ions in the crystal compensates for a stoichiometric defect which occurs during epitaxial growth of the GaAs crystalline layer. This results in a high resistivity layer which provides a buffer layer between a GaAs substrate and an active GaAs layer. Further, by introducing carbon in the form of carbon dioxide, oxygen released during reduction of the carbon dioxide by reacting the carbon dioxide with hydrogen during the doping of the GaAs produces water. The water reduces the concentration of unwanted silicon oxide material generally introduced by the reactor vessel and contaminants and which is associated with unwanted background donor doping of the GaAs. By reducing the concentration of silicon oxide, the concentration of stoichiometric defects becomes the principle donor source, thus enabling optimum compensation thereof with carbon doping.

7 Claims, 4 Drawing Figures

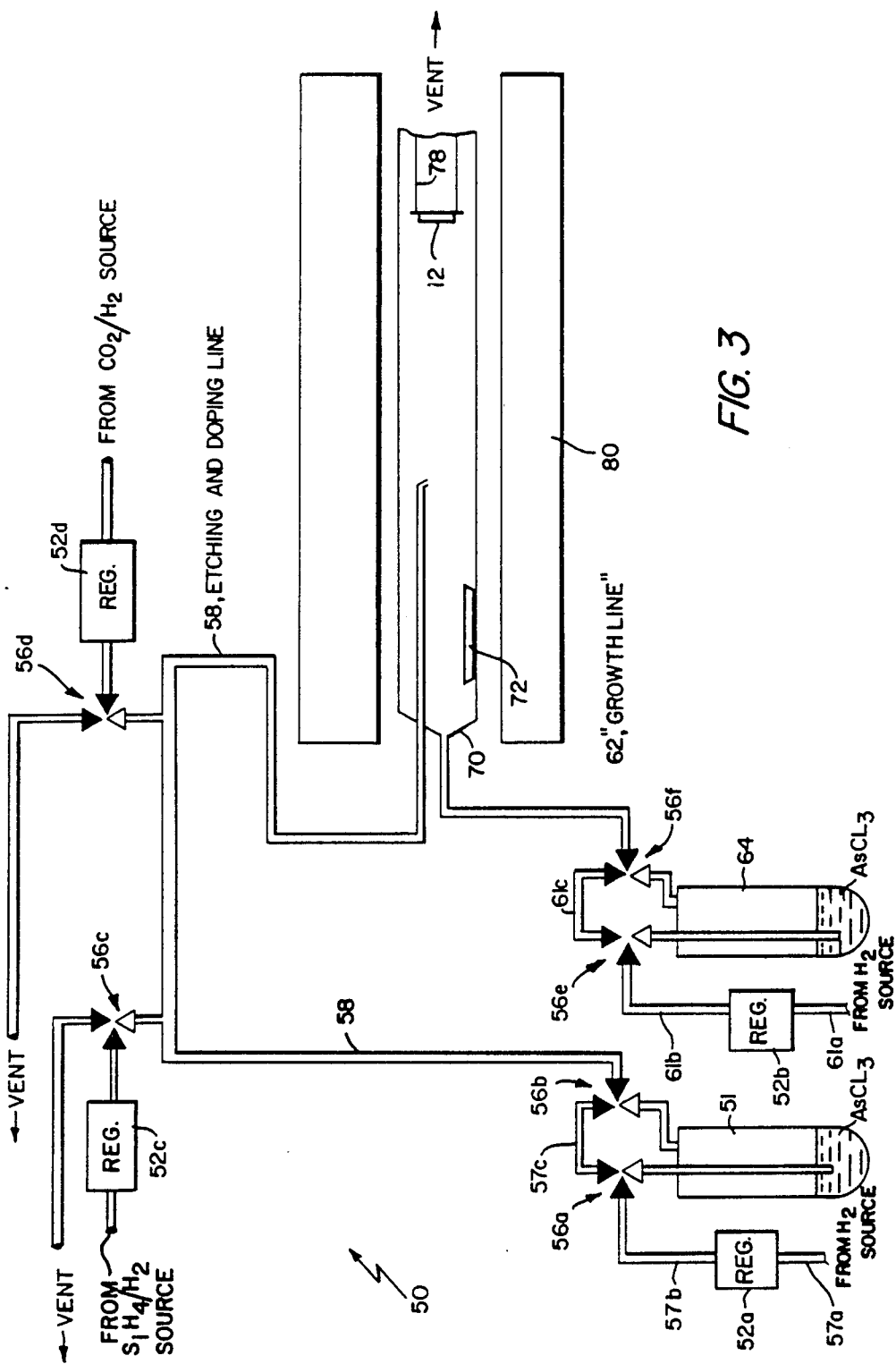

VAPOR PHASE EPITAXIAL GROWTH OF CARBON DOPED LAYERS OF GROUP III-V MATERIALS

BACKGROUND OF THE INVENTION

This invention relates generally to semiconductor devices and manufacturing methods and more particularly to semiconductor devices formed by vapor phased epitaxy.

As is known in the art, semiconductor devices such as field effect transistors are often employed to amplify radio frequency power by feeding an r.f. voltage signal to a gate electrode to control the conductivity of a drain-source channel underlying the gate electrode. As such, radio frequency performance is dependent upon the quality of the crystalline structure of the semiconductor layers used to form the field effect transistor. As is also known in the art, Group III–V semiconductor materials system such as a system employing gallium arsenide (GaAs) are often used to fabricate field effect transistors for amplifying radio frequency power.

One technique used in the prior art to provide high quality field effect transistors is to grow active regions for the field effect transistors directly on GaAs substrates. A substrate comprising gallium arsenide for use in fabricating such field effect transistors generally is prepared with a relatively high bulk resistivity typically in the range of $10^7$–$10^8$ ohm-cm. This relatively high resistivity is required so that field effect transistors will be fabricated with relatively low leakage currents. Leakage current affects field effect transistor r.f. performance since a leakage current cannot readily be controlled or modulated by the r.f. voltage signal applied to the gate electrode.

Generally, two methods are employed in the prior art to prepare substrates of GaAs having a relatively high bulk resistivity. One method, the so-called Horizontal Bridgeman Technique involves the steps of introducing elemental Ga and As into an open quartz reaction vessel, reacting the Ga and As to form a GaAs melt, and slowly withdrawing the sealed vessel from the furnace to form a crystalline structure. The crystalline structure is sliced into wafers which are then lapped and polished. Because residual donor ions originating from the quartz reaction vessel are now present in the crystal reducing the crystal's resistivity, this method generally requires doping with a material such as chromium to provide relatively high resistivity substrates having relatively low dislocation densities. Chromium, having electrons at an energy level intermediate the crystal's valance band energy level and the crystal's conduction band energy level, is a deep level acceptor which neutralizes the residual donor ions to thereby increase the crystal's resistivity. One problem associated with chromium doping is that the rate of recombination of electrons and holes between the valance band and intermediate energy level of the chromium is lower than the rate of change of an injection current flux in the conduction band resulting in a net fixed negative charge of chromium ions. At the active layer/substrate interface, these chromium ions repel electrons in the channel of the device resulting in a loss of power. A second problem associated with chromium doping is that chromium has a tendency to out diffuse from the substrate into the active layer/substrate interface region resulting in a decrease in electron mobility and degraded device performance.

In a second method, the so-called "Czochralski Technique," a seed crystal is slowly withdrawn from a GaAs melt in a controlled atmosphere. This technique is particularly useful in providing relatively large circular substrates of GaAs. Several variations of this technique have been developed. The more widely used one is the so-called "Liquid Encapsulated Czochralski Technique" where the seed crystal is pulled through a layer of melted boron oxide which acts an an encapsulant to assist in the prevention of arsenic from leaving the melt, a problem generally common to all variations of the "Czochralski Technique." As described in an article entitled "Compensation Mechanism in Liquid Encapsulated Czochralski GaAs: Importance of Melt Stoichiometry" published in the IEEE Transactions on Microwave Theory and Techniques, Vol. MTT-30, No. 7, July 1982, by D. E. Holmes, R. T. Chen, K. R. Elliott, C. G. Kirkpatrick, and Phil Won Yu, carbon atoms provided by chemical contaminants which are present in the GaAs melt used to form the GaAs substrate act as electrically active impurities which compensate for a defect in the stoichiometry of the substrate. The stoichiometric defect often denoted as "EL2," is a result of extra or interstitial arsenic atoms being present in the crystal lattice. Each one of such arsenic atoms has an electron at an energy level which is intermediate the valance band energy level and the conduction band energy level of the GaAs crystal. When ionized by an electron current flux, the extra or interstitial arsenic atoms provide such electrons into the conduction band of the crystal thereby reducing the resistivity of the substrate and providing positive ions in the crystal. The presence of carbon compensates for this electron by accepting an electron from the valance band of the crystal thereby creating a hole current in the valance band and providing a negative ion in the crystal. As described in the above-mentioned article, the high resistivity of the substrate is provided by controlling the ratio of arsenic to gallium in the melt to thereby provide a controlled concentration of stoichiometric defects.

However, the quality of the crystalline structure of substrates fabricated by either method, particularly by the Czochralski technique are generally not suitable for fabrication of high quality field effect transistors directly thereon, because inside the crystalline structure close to the surface of the substrate unwanted crystalline defects such as hole-and-electron traps are present which can degrade the electrical properties of a device fabricated directly thereon. These traps can become ionized sites when they accept or emit an electron. Thus, during operation of a field effect transistor, the electric field created by ionization of traps will restrict the flow of electrons in the channel, an effect generally known in the art as "backgating," with a concomitant loss in power. Currently, therefore much work is going into techniques which will provide high quality gallium arsenide substrates having relatively high resistivities and relatively high crystal quality.

As is also known in the art, a second alternate solution to the problem of fabricating low leakage field effect transistors which overcomes the low crystalline quality for GaAs substrates is to first grow a high resistivity buffer layer over the substrate surface and then grow the active regions of the field effect transistor on the buffer layer. The buffer layer provides a high quality, high resistivity layer which shields the active regions of the field effect transistor from defects in the GaAs substrate crystal. The buffer layer preferably should have a high resistivity and also should be relatively thick to adequately isolate the active regions from crystal defects present in the crystalline structure of the substrate.

One method suggested for accomplishing this is the use of a vapor-phase epitaxial method wherein a liquid gallium source is saturated with arsenic gas to form a crust of highly pure gallium arsenide. One problem associated with this method is that the saturation condition for the liquid gallium source as well as the topographic structure of the crust is very difficult to control due to the effect of convection in the liquid gallium and the arsenic containing gas. Consequently, the ratio of gallium to arsenic is also difficult to control, giving rise to changes in the stoichiometry of the epitaxially grown crystal layer. These stoichiometry changes result in the above-mentioned stoichiometric defect, that is, the extra or interstitial arsenic atoms. It is believed that the resistivity of such substrates is provided by compensating for such stoichiometric defects with carbon which is provided on the GaAs substrate from contaminants in a similar manner as described in the above-mentioned article. The carbon on the surface of the substrate out diffuses as the thickness of the epitaxially grown buffer layer increases so that the concentration of carbon correspondingly decreases as the thickness of the buffer layer increases. Because the active layer is formed epitaxially on this intermediate high resistivity buffer layer, and because of the difficult nature of controlling the concentration of carbon impurities on the surface of the substrate, epitaxial growth of buffer layers greater than 1-2 $\mu$m having predetermined resistivities is generally difficult to obtain. Thus, the resistivity of buffer layers obtained by using a liquid gallium source method is typically difficult to control and also difficult to reproduce being dependent upon the amount of contaminants present in the substrate as well as the growth conditions for the epitaxial layer. Therefore, because of the thin buffer layers, the active regions of the field effect transistors grown on such buffer layer are close to the substrate/buffer layer interface, and thus the buffer layer will not generally adequately isolate the active region from the defects in the substrate crystal. Thus, during operation of a field effect transistor, electrons in the channel are not adequately shielded from the electric field created by traps present at the substrate-buffer layer interface thereby constricting the channel of the field effect transistor and resulting in a loss of power.

A second method suggested in the art is to grow a doped buffer layer using chromium as a dopant. For the reasons discussed above in reference to substrate doping, chromium or a similar "deep level" acceptor is not an adequate solution in certain applications because the rate of recombination of electrons and holes between the valance band and the acceptor atom is often lower than a rate of charge of an injected electron flux in the conduction band. This results in a fixed negative charge at the buffer layer/active layer interface which repels electrons in the active layer thereby constricting the channel. Further, it is also believed that chromium has a tendency to out diffuse from the buffer layer into the active region. This diffusion is undesirable because it results in a decrease in electron mobility which affects current density and thus device performance.

SUMMARY OF THE INVENTION

In accordance with the present invention, a method of growing a doped crystalline layer with a predetermined resistivity characteristic includes the steps of: Controllably doping the crystalline layer with a material which provides in the crystal an electron energy level between a valance energy band and a conduction energy band of the crystal layer. The dopant is used to compensate for an electron energy level provided in the crystal as a result of imperfections on the stoichiometry of the crystal layer. Such imperfections are generally caused by extra or interstitial crystal atoms in the layer. The dopant is selected to provide such compensating electron energy level substantially removed from the electron energy level provided from the crystal defect but within the energy gap, that is, between the valance and conduction bands of the crystal. The concentration of the dopant and the type of dopant are further selected in accordance with the concentration and type of stoichiometric defects to provide the predetermined resistivity characteristic. By introducing such dopant in a controlled manner to neutralize the excess atoms of the stoichiometric defective crystal layer, relatively thick crystal layers having high, predetermined resistivities may be formed.

In accordance with an additional aspect of the present invention, a method of growing a high resistivity crystalline buffer layer includes the step of doping the buffer layer with a predetermined amount of carbon. With such method, controlled doping with carbon compensates for stoichiometric defects in the crystal buffer layer providing a high resistivity buffer layer.

In accordance with an additional aspect of the present invention, a method of epitaxially growing a high resistivity Group III-V crystalline buffer layer includes the step of doping the buffer layer during epitaxial growth with a predetermined amount of carbon. The carbon is provided during epitaxial growth of the buffer layer by introducing a predetermined amount of carbon dioxide during growth of the layer. With such method, the number of carbon atoms is selected in accordance with the concentration of the stoichiometric defects which result from excess or interstitial crystal atoms (Group V) being provided in the crystal and having an electron energy level intermediate a valance band energy level and a conduction band energy level of the crystal. When ionized by an electron flux current, the extra or interstitial Group V atoms provide electrons into the conduction band of the crystal thereby upsetting charge balance in the crystal. The carbon atoms provide a shallow energy acceptor site having an electron energy level just above the valance band energy level of the crystal, and substantially below the electron energy level provided by the stoichiometric defects. Each carbon atom when ionized accepts an electron from the valance band thereby leaving a positive charge in the valance band to compensate for the excess negative charge in the conduction band, and thus, compensating for the extra or interstitial Group V atoms. Further still, by introducing carbon in the form of carbon dioxide, oxygen released during reduction of the carbon dioxide by reaction with hydrogen results in an increase in the concentration of water. The increased concentration of water reduces the concentration of silicon oxide resulting from the reaction with the reactor vessel. Silicon oxide is the form of silicon primarily responsible for unintentional background donor doping of Group III-V layers. Thus, by reducing the background donor doping, the extra or interstitial Group V atoms become the primary donor dopant permitting optimum compensation thereof with the shallow carbon acceptor.

BRIEF DESCRIPTION OF THE DRAWINGS

The foregoing features of the invention, as well as the invention itself, may be more fully understood from the following description of the drawings, in which:

FIG. 3 is a schematic diagram of an apparatus suitable for use in the practice of the present invention.

DESCRIPTION OF THE PREFERRED EMBODIMENT

Figure 1:
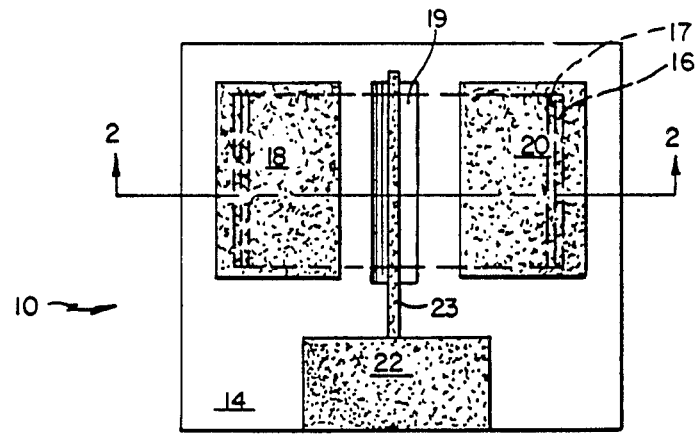
FIG. 1 is a plan view of a field effect transistor fabricated in accordance with the present invention.
Figure 2:
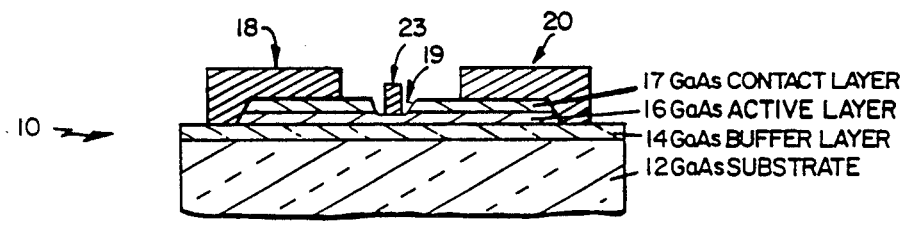
FIG. 2 is a cross-sectional view taken along line 2—2 of FIG. 1 showing typical semiconductor regions which form the field effect transistor of FIG. 1.

Referring now to FIGS. 1 and 2, a field effect transistor (FET) 10 is shown to include a gallium arsenide substrate 12 having a plurality of sequentially vapor phased epitaxially deposited layers 14, 16 and 17 of gallium arsenide formed on a first surface of such substrate 12. Layer 14 is here a high resistivity buffer layer, layer 16 is here a mesa-shaped moderately doped type active layer used to form here an n-channel FET, and layer 17 is here a mesa-shaped heavily doped n+type contact layer used to provide a low ohmic contact region for drain and source electrodes 18, 20, as is known in the art. Drain and source electrodes 18, 20 are provided on portions of layer 17. A recess 19 is provided in contact layer 17 exposing an underlying portion of active layer 16 intermediate said drain electrode 18 and source electrode 20. A thin gate electrode 23 is formed in said recess 19 and the thin gate electrode 23 is integrally connected to a gate pad 22, as shown.

Referring now to FIG. 3, a schematic representation of an open tube vapor phased epitaxial apparatus 50 used to form the FET 10 shown in FIG. 1 in accordance with the present invention is shown to include a vapor phased epitaxial reactor, here a fused silica or quartz furnace tube 70. The furnace tube 70 is inserted within a multiple zone furnace 80. The substrate 12 here of gallium arsenide is placed within the furnace tube 70 upon a support member 78, here comprised of fused silica and orientated perpendicular to the center axis of the furnace tube 70, as shown. Substrate 12 is here a bulk gallium arsenide substrate upon which is to be sequentially epitaxially grown the semi-insulating buffer layer 14, the active layer 16 and the contact layer 17 of the field effect transistor 10. Also positioned in the furnace tube 72 is a fused silica boat 72 containing solid gallium arsenide from which is provided a source of gallium arsenide to epitaxially grow gallium arsenide on the gallium arsenide substrate 12, in a manner to be described.

After the substrate 12 and the boat 72 of gallium arsenide are disposed in the furnace tube 70, all the atmospheric gases are purged from the interior of the furnace tube 70 and the epitaxial growth apparatus 50. A pure atmosphere of hydrogen is then introduced into such furnace tube 70 from a hydrogen source (not shown) as will be described. The temperature within the multiple temperature zone furnace 80 is raised to provide a desired temperature profile, with the substrate 12 being held at a temperature of 700° C. and the boat 72 containing the gallium arsenide source being held at a temperature of 760° C., for example. Other temperatures for the substrate 12 and the boat 72 may be used as well to obtain a desired growth rate. Two intermediate temperature zones are provided between the gallium arsenide in boat 72 and the substrate 12 to provide an approximate linearly declining temperature between boat 72 and substrate 12. Furnace tube 70 is fed by two fused silica tubes 62 and 58.

Tube 62, "the growth line," is fed from a solenoid actuated flow control valve 56f. The normally deactivated state of solenoid valve 56f, and a solenoid valve 56e, enable hydrogen gas to pass from the hydrogen source (not shown) via a fused silica tube 61a to a flow regulator 52b, to valve 56e via a fused silica tube 61b, to valve 56f via a fused silica tube 61c and emerge from valve 56f to tube 62, "the growth line", to purge the furnace tube 70 of atmospheric gases as described above. During epitaxial growth of gallium arsenide on the substrate 12, valves 56e, 56f are placed in their activated state enabling the hydrogen gas to pass through tube 61a through the regulator 52b and valve 56e into a bubbler 64 which contains liquid arsenic trichloride ($AsCl_3$). The liquid arsenic trichloride ($AsCl_3$) within bubbler 64 is maintained at a constant temperature in the range of 0° to 20° C. by a coolant fluid (not shown) constantly circulated into cooling jackets (not shown) which surround the bubbler 64. The hydrogen gas bubbled through the arsenic trichloride picks up molecules of arsenic trichloride as the hydrogen bubbles through to the fluid of arsenic trichloride. A mixture of hydrogen gas and arsenic trichloride emerges from bubbler 64 through activated valve 56f. The mixture of hydrogen and arsenic trichloride emerges from the activated valve 56f into tube 62 and emerges therefrom upstream from the boat 72 of gallium arsenide disposed in furnace tube 70.

Tube 58, the "etching and doping line," is fed from a solenoid valve 56b. Hydrogen gas from a hydrogen source (not shown) is fed to a fused silica tube 57a through a regulator 52a, to a fused silica tube 57b and through a deactivated solenoid valve 56a to tube 57c. Tube 57c feeds hydrogen gas to a deactivated solenoid valve 56b and to the tube 58. Thus, the normally deactivated state of solenoid valves 56a, 56b enables hydrogen gas to pass from the hydrogen source (not shown) to tube 58, the "etching and doping line", to purge the furnace tube 70 of atmospheric gases as described above. During a pre-etch step valve 56a is activated and valve 56b is activated simultaneously therewith so that regulated hydrogen gas passes from the hydrogen source (not shown) to a bubbler 51 containing liquid arsenic trichloride (also maintained at a constant temperature in the range of 0° to 20° C. as bubbler 64) producing a mixture of hydrogen gas and arsenic trichloride. The gaseous mixture of hydrogen gas and $AsCl_3$ is fed through valve 56b through tube 58. Tube 58 is also fed from a solenoid valve 56c which is normally closed in its deactivated state, and a second solenoid valve 56d also normally closed in its deactivated state. During a first doping step, solenoid valve 56d is activated and solenoid valves 56a-56c are deactivated enabling a mixture of carbon dioxide and hydrogen ($CO_2/H_2$) to pass through regulator 52d and solenoid valve 56d, and thus through tube 58d. The carbon dioxide/hydrogen mixture is further mixed with the hydrogen carrier gas in tube 58 to enable growth of a carbon doped buffer layer 14 on substrate 12 in conjunction with activation of valves 56e, 56f in a manner to be described. During a second doping step, solenoid valve 56c is activated and solenoid valves 56a, 56b, 56d are deactivated enabling silane gas ($SiH_4$) to pass through a regulator 52c, the solenoid valve 56c and tube 58 during epitaxial growth of active doped layers 16, 17 of gallium arsenide on the buffer layer 14. The silane and hydrogen gas is mixed with the hydrogen carrier gas in tube 58 to provide a mixture of silane gas and hydrogen in a predetermined ratio, in accordance with a predetermined doping profile. When either one of solenoid valves 56c and 56d is deactivated, silane/$H_2$ and $CO_2/H_2$ are fed through such valves 56c, 56d and are vented to maintain proper pressure and prevent build-up of contaminants.

In operation then, after the substrate 12 and the boat 72 of gallium arsenide are placed in a furnace tube 70 and such furnace tube 70 is purged of atmospheric gas by introduction of hydrogen gas as described above, then, the outwardly exposed surface of the substrate 12 is cleaned and etched before growth of the various doped epitaxial layers 14, 16 and 17. When substrate 12 has reached a stable temperature, valves 56e and 56f are activated enabling a mixture of hydrogen and arsenic trichloride gases to emerge from tube 62 upstream from the gallium arsenide in boat 72, and valves 56a and 56b are activated enabling a mixture of hydrogen and arsenic trichloride gases to emerge from tube 58 downstream from the boat 72 containing the gallium arsenide, as shown. The gaseous hydrogen and arsenic trichloride are at a desired operating temperature and will decompose into gaseous arsenic and gaseous hydrogen chloride in accordance with the following reaction:

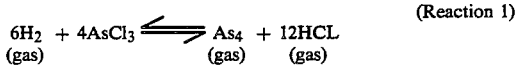

$$6H_2 + 4AsCl_3 \rightleftharpoons As_4 + 12HCL \quad \text{(Reaction 1)}$$
(gas) (gas) (gas)

The gaseous hydrogen chloride produced etches the surface of substrate 12 and the surface of the gallium arsenide in boat 72 thereby freeing each from contaminants.

After the surface of substrate 12 and the surface of the gallium arsenide in boat 72 have been etched and cleaned, the buffer layer 14 is epitaxially grown upon substrate 12. The buffer layer 14 is grown on the substrate 12 as follows: valves 56a, 56b and 56c are placed in a deactivated state with valves 56e and 56f remaining in an activated state, and valve 56d being placed in an activated state. By deactivating valves 56a and 56b as previously described, arsenic trichloride from bubbler 51 is inhibited from flowing through tube 58, and by deactivating valve 56c, silane gas, a dopant used in growth of active layer 16 and contact layer 17, is inhibited from flowing through tube 58, and by activating valve 56d a gaseous mixture of carbon dioxide and hydrogen is fed through regulator 52d and valve 56d to tube 58. A nearly instantaneous transition from vapor etched to epitaxial growth of GaAs is thereby produced when said valves are placed in the above-described states in accordance with reaction 2:

$$12 HCL + 4 GaAs \rightleftharpoons 4GaCL_3 + 6H_2 + As_4 \quad \text{(Reaction 2)}$$

The gaseous hydrogen chloride etches the surface of the solid gallium arsenide source in boat 72 producing gaseous gallium trichloride $GaCL_3$ and gaseous arsenic. The gallium trichloride and arsenic vapors are transported to the substrate 12 where they are cooled due to the temperature difference in the multiple zone furnace 80 and gallium arsenide condenses out of the vapor stream in accordance with reaction 3:

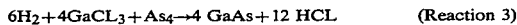

$$6H_2 + 4GaCL_3 + As_4 \rightarrow 4 GaAs + 12 HCL \quad \text{(Reaction 3)}$$

The exposed and previously etched cleaned surface of substrate 12 acts as a nucleation site for the condensed vapors of gallium arsenide produced from etching the gallium arsenide in boat 72. During the growth process, gallium trichloride and arsenic ($As_4$) are continually produced to replace that consumed by the epitaxial growth process by the continuous flow of $AsCl_3$ vapors from tube 62 across the surface of the gallium arsenide in boat 72. While gallium arsenide is being epitaxially grown on the surface of substrate 12, a dopant here carbon provided in the form of carbon dioxide is controllably introduced, via tube 58. Carbon is provided as a dopant of the gallium arsenide at the elevated temperature in accordance with reaction 4:

$$2H_2 + CO_2 \rightleftharpoons 2H_2O + C \quad \text{(Reaction 4)}$$

As shown, the resulting products include $H_2O$ which affects the SiO concentration according to reaction 5:

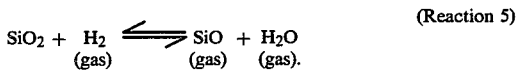

$$SiO_2 + H_2 \rightleftharpoons SiO + H_2O \quad \text{(Reaction 5)}$$
(gas) (gas) (gas).

where $SiO_2$ is supplied from reaction with the quartz tube 70 and other quartz components of the apparatus 50.

Silicon from SiO is the dopant primarily responsible for background donor doping in the buffer layer 14. Thus, the increase in the concentration of $H_2O$ provided by reaction 5 when $CO_2$ is injected according to reaction 4, will drive reaction 5, to the left to establish a new equilibrium, and thus reduce the concentration of SiO and, hence, the background donor doping of the buffer layer 14, in a manner to be described. The mole fraction of $AsCl_3$ used is here $8 \times 10^{-3}$ and the mole fraction of $CO_2$ used here is in the range of $1 \times 10^{-3}$ to $10 \times 10^{-3}$ with $5 \times 10^{-3}$ being the preferred mole fraction.

After the buffer layer 14 is grown to a predetermined thickness, valve 56d is again placed in its deactivated state and valves 56a and 56b are placed in their activated state again, thereby permitting arsenic trichloride to be carried through tube 58 for etching the surface of the buffer layer 14, in accordance with reaction 1, as described above. After the surface of the buffer layer 14 is cleaned and etched, the valves 56a and 56b are again deactivated and valve 56c is then activated enabling silane gas and hydrogen ($SiH_4/H_2$) in a concentration of here 5 parts per million of silane gas to flow from regulator 52c through valve 56c and into tube 58. Here, the exposed and previously etched, cleaned surface of buffer layer 14 acts as a nucleation site for vapors of gallium arsenide produced from etching the gallium arsenide in boat 72 in a similar manner as previously described. During the growth process of the active layer 16 on buffer layer 14, gallium arsenide is continually produced to replace that consumed by the epitaxial growth process by the continuous flow of vapors from tube 62 across the gallium arsenide in boat 72. The GaAs vapor is transported by the hydrogen gas toward the substrate 12 as described above. Thus, as the gallium arsenide is epitaxially grown on the surface of the buffer layer 14, an n-type dopant material, here the silane gas (SiH4) is controllably introduced as the dopant material for growing the GaAs n doped active region, as is known in the art. The silane gas is introduced through tube 58 by activating solenoid valve 56c.

After active layer 16 is grown to a predetermined thickness, the active layer 16 surface is again etched in accordance with equation 1, and the contact layer 17 is grown. Contact layer 17 here a conventional n+ layer, is grown in a similar manner as described above, for n-type layer 16 except that the concentration of silane dopant gas is increased to here 15 ppm.

Figure 4:
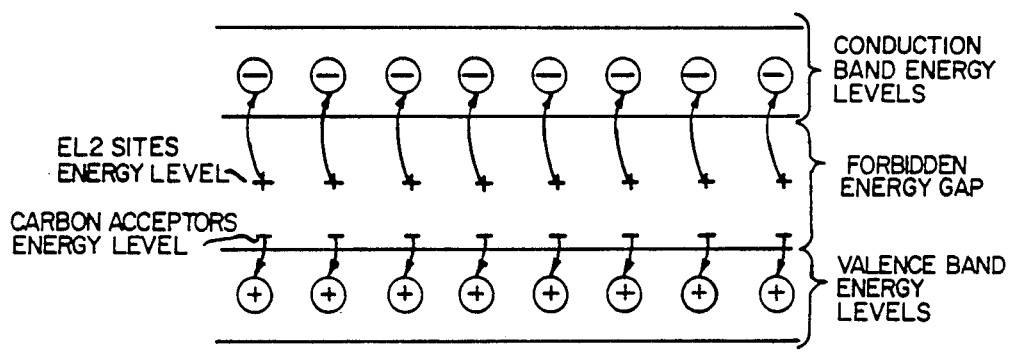
FIG. 4 is a diagrammatical representation of a theoretical band energy diagram of a typical semiconductor material having electron energy levels caused by stoichiometric crystal defects and electron energy levels provided from doping in accordance with the invention.

As described in an article entitled "Compensation Mechanism in Liquid Encapsulated Czochralski GaAs: Important of Melt Stoichiometry" by D. E. Holmes et al, IEEE Transactions on Microwave Theory and Techniques, Vol. MTT 30, No. 7, July, 1982, the free electron concentration (n) in an undoped semiinsulating gallium arsenide material is given by:

$$n = K\,([EL2]/([C] + N_A{}^R - N_D))\qquad\text{(Equation 1)}$$

where [C] is the concentration of carbon, $N_A{}^R$ is the residual acceptor concentration, $N_D$ is the background donor density, and where [EL2] is the concentration of a stoichiometric defect commonly referred to as "a deep donor level." Such stochiometric defects are imperfections within the semiconductor crystal which disrupt the perfect periodicity of the crystal/lattice and as a result introduce an undesirable energy level, here a donor energy level into a forbidden energy gap of the crystal energy band such as depicted in FIG. 4. Such stoichiometric defects in gallium arsenide epitaxial layers are generally attributable to As-rich growth conditions during vapor phase epitaxial growth. These energy levels are substantially midway between the energy level of the conduction band and the energy level of the valance band. When ionized, these energy levels provide additional electrons into the conduction band thereby decreasing the resistivity of the gallium arsenide material. This effect is particularly detrimental in field effect transistors since a lower resistivity will increase leakage currents and degrade device performance. Thus, these EL2 levels must be compensated for in order to maintain a high resistivity buffer layer. As previously described, chromium doping is often used to compensate for the energy level provided by the stoichiometric defect EL2. However, it is believed that in some applications due to the relatively large ionization energy of the deep level acceptor, chromium, the rate of recombination of electrons and holes in the valance band and the capture of electrons from the valance band by the deep level acceptor is often lower than the rate of change of an injected electron flux in the conduction band. Thus, a net fixed negative charge of ionized deep level acceptors is provided at the buffer layer/active layer interface which repels electrons in the active layer or channel area thereby constricting the channel. Further, it is also believed that chromium has a tendency to out diffuse from the buffer layer to the buffer layer/active region interface and into the active region. This diffusion of chromium is undesirable because it results in a decrease in electron mobility in the channel area which affects current density and thus device performance.

In vapor phase epitaxy systems as described in the abovementioned article, unintentionally doped buffer layers obtain their high resistivity from out diffusion of carbon and residual acceptors ($N_A{}^R$) from the surface of the substrate combined with the unintentional introduction of carbon or residual acceptors ($N_A{}^R$) during the growth process. Carbon and other such acceptors are provided from contaminants occurring on the substrate surface and bulk, for example. That is, carbon is generally found as an unintentional dopant in gallium arsenide material and is generally understood to electrically compensate for the deep levels or stoichiometric defects formed in the gallium arsenide crystal by providing a acceptor site.

In accordance with the present invention, stoichiometric defects such as extra or interstitial arsenic atoms in the gallium arsenide crystal provide an energy level which is here compensated for by providing a controllable, predetermined concentration of carbon. Since carbon is a shallow energy acceptor providing an electron energy level just above the valance energy band of the crystal, the recombination of electrons between the electron energy level of the carbon atoms and the valance band will alternately follow the change in the electron current density in the active layer, without the concomitant build-up of a net negative charge as associated with chromium or "deep level acceptor" doping. Carbon, as a shallow acceptor will capture an electron from the valance band since the ionization energy for the electron energy level provided by carbon is generally small, about 0.02 electron volts (ev) above the balance band of the crystal. This provides a net positive (hole) charge in the valance band. The compensation of extra or interstitial arsenic by carbon occurs as follows. When the extra or interstitial arsenic ionizes, it gives up an electron into the conduction band providing a net negative (electron) current in the conduction band and a positive charge (the ionized extra or interstitial arsenic) in the forbidden gap. On the other hand, when carbon is ionized, it accepts electrons from the valance band of the crystal providing a net positive charge in the valance band (holes) and a net negative charge in the forbidden gap due to the ionized carbon. Therefore, when the concentration of stoichiometric defects [EL2] and the concentration of carbon acceptors [C] are in equilibrium, there is a reduction of net charge in the crystal. That is, as the stoichiometric defects provide an excess of electrons into the conduction band, the carbon atom will provide an excess of holes into the valance band thus neutralizing the effect of the stoichiometric defects. This is particularly advantageous to growing high resistivity buffer layers, such as buffer layer 14.

As described in the above-mentioned article, the concentration of stoichiometric defects (EL2) can be controlled by controlling the arsenic pressure. In solid source growth systems such as that described in the present invention, the arsenic pressure can be more accurately controlled. This is because the arsenic pressure in general is dependent upon the reaction which takes place with the source material. In a solid source growth system as described here, the GaAs in boat 72 is in a solid state, and a convectional flow of the liquid gallium as in the conventional liquid source system described in the above-mentioned article is not present. Thus, the ratio of As:Ga is more controlled and a particular point can be selected in tube 70 where GaAs can condense out of the vapor stream. Since the concentration of EL2 is related to the concentration of arsenic in the gas stream, the concentration of EL2 can be controlled. Thus, as carbon is controllably introduced during growth, a constant acceptor level is maintained to optimize the compensation ratio in accordance with the controlled concentration of stoichiometric defects (EL2) obtained by controlling the As pressure. Therefore, by controlling the arsenic pressure and by controllably introducing carbon in the form of $CO_2$, the concentrations of [EL2] and [C] are controlled and therefore an optimum compensation level is provided to obtain a higher resistivity buffer layer 14.

As also mentioned in the above article, the free electron concentration (n) is also dependent upon $N_D$, the background shallow donor density. Therefore, the background shallow donor density needs to be reduced in order that the stoichiometric defect density [EL2] is the predominant donor level. This is accomplished concurrently with carbon doping as follows: preferably carbon as a dopant is controllably introduced as carbon dioxide ($CO_2$) at an elevated temperature, and is reduced according to reaction 4:

$$2H_2 + CO_2 \rightleftharpoons 2H_2O + C \qquad \text{(Reaction 4)}$$

as previously described. The resulting product includes water $H_2O$ which affects the silicon concentration according to reaction 5:

$$SiO_2 + H_2 \rightleftharpoons SiO + H_2O \qquad \text{(Reaction 5)}$$

Since the reaction described in Reaction 5 increases the concentration of $H_2O$ the reaction described in Reaction 5 will be driven to the left until a new equilibrium is established thereby reducing the SiO concentration in the gas stream, and hence, reducing the shallow background donor density $N_D$ since silicon provided from silicon oxide is the principal shallow donor dopant, as previously described.

Thus, optimum compensation can be obtained in accordance with Equation 1 by controlling the As pressure to thereby control the concentration of stoichiometric defects or deep level donors [EL2]; controllably introducing $CO_2$ to provide a predetermined concentration of [C] in accordance with Reaction 2; and increasing the concentration of $H_2O$ to reduce background donor doping. Thus, the stoichiometric defect (deep level donor) [EL2] is the predominant donor, and the ratio of [EL2] to [C] is optimized, thereby providing a high resistivity layer of GaAs. Further, since $CO_2$ is constantly introduced during growth of the buffer layer to compensate for stoichiometric defects and to reduce background doping with Si, the buffer layer 14 can be grown to any arbitrary thicknesses to enhance electrical properties of a device formed thereon by increasing the spacing or electrical isolation between active semiconductor areas and the substrate/buffer layer interface where the unwanted crystal defects such as electron traps are generally present as discussed in the "Background of the Invention" section. Thus, this method of growing a buffer layer provides a high resistivity buffer layer and a thick buffer layer to shield active areas of a device from the effects of crystal defects in the substrate.

Thus, the controlled introduction of $CO_2$ to provide carbon as a dopant in the epitaxial growth of a high resistivity buffer layer 14 provides two effects: (1) the $CO_2$ is reduced according to Reaction 4 thereby providing a predetermined concentration of carbon to compensate for a predetermined concentration of a stoichiometric defect; and (2) as a result of the reduction of $CO_2$, $H_2O$ is produced which affects the concentration of SiO and hence the residual silicon background doping density $N_D$ thereby permitting optimum compensation of [EL2] by [C] and hence growth of high resistivity buffer layer 14.

Having described preferred embodiments of the invention, it will now be apparent to one of skill in the art that other embodiments incorporating its concept may be used. It is felt, therefore, that this invention should not be restricted to the disclosed embodiment, but rather should be limited only by the spirit and scope of the appended claims.

What is claimed is:

1. A method of forming a carbon doped layer of Group III-V material comprising the steps of:
   growing the Group III-V layer by directing a vapor flow comprising components of said Group III-V material towards a substrate and condensing out of said vapor stream onto said substrate the Group III-V material;
   controllably introducing a predetermined concentration of carbon dioxide in said vapor stream during growth of the Group III-V material to provide the carbon doped layer of Group III-V material.

2. The method as recited in claim 1 wherein the concentration of carbon atoms is selected to provide the doped layer having a resistivity of at least $10^7$ ohm-cm.

3. A method of growing an epitaxial layer of gallium arsenide on a substrate with a selected resistivity characteristic comprising the steps of:
   growing a layer of GaAs over a substrate by directing a vapor flow comprising components of the gallium arsenide material towards the substrate and condensing out of said vapor stream onto said substrate the GaAs layer;
   introducing a predetermined flow of carbon dioxide; reducing the carbon dioxide into carbon; and
   depositing said condensed gallium arsenide and a selected concentration of carbon onto the substrate, with said carbon concentration selected to provide the carbon doped layer having a resistivity of at least about $10^7$ ohm-cm.

4. The method as recited in claim 3 further comprising the steps of:
   controlling a vapor pressure of arsenic to provide a predetermined concentration of a stoichiometric defect; and
   compensating for the predetermined concentration of the stoichiometric defect by controlling the concentration of carbon dopant.

5. The method as recited in claim 4 wherein silicon oxide is present during growth of the epitaxial layer further comprising the step of:
   reducing the concentration of said silicon oxide in accordance with the reactions:

$$2H_2 + CO_2 \rightleftharpoons 2H_2O + C \text{ and } SiO_2 + H_2 \rightleftharpoons SiO + H_2O$$

to reduce a concentration of silicon in the epitaxial layer provided from said silicon oxide.

6. The method as recited in claim 3 wherein a mole fraction of arsenic trichloride is substantially $8 \times 10^{-3}$ and a mole fraction of carbon dioxide is in the range of $1 \times 10^{-3}$ to $10 \times 10^{-3}$.

7. The method as recited in claim 3 further comprising the steps of:

etching a surface of the substrate, freeing said surface of contaminants, and providing nucleation sites on said surface; and depositing said condensed gallium arsenide and selected concentration of carbon on said etched substrate surface.

* * * * *